United States Patent
Dedic

(10) Patent No.: US 6,218,974 B1
(45) Date of Patent: Apr. 17, 2001

(54) DATA MULTIPLEXING IN MIXED-SIGNAL CIRCUITRY

(75) Inventor: Ian Juso Dedic, Northolt (GB)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/634,590

(22) Filed: Aug. 8, 2000

(30) Foreign Application Priority Data

Nov. 10, 1999 (GB) ................................. 9926648

(51) Int. Cl.$^7$ ......................................... H03M 1/66
(52) U.S. Cl. ............................. 341/144; 341/141
(58) Field of Search ................................ 341/141, 144, 341/135; 327/303

(56) References Cited

U.S. PATENT DOCUMENTS

| | | | |
|---|---|---|---|
| 4,896,157 | * | 1/1990 | Mijuskovic ........................... 341/144 |
| 5,394,146 | | 2/1995 | Arimoto . |
| 5,703,585 | * | 12/1997 | Lamm ................................. 341/141 |

FOREIGN PATENT DOCUMENTS

| | | |
|---|---|---|
| 2 333 171 | 7/1999 | (GB) . |
| 2 333 190 | 7/1999 | (GB) . |
| 2 333 191 | 7/1999 | (GB) . |
| 2 335 097 | 9/1999 | (GB) . |
| 2 341 287 | 3/2000 | (GB) . |

* cited by examiner

Primary Examiner—Brian Young
(74) Attorney, Agent, or Firm—Staas & Halsey LLP

(57) ABSTRACT

Mixed-signal circuitry comprises analog (14) and digital (100, 200) circuitry and is operative repetitively to perform a series of processing cycles. The analog circuitry (14) is operable in each processing cycle to receive a set of digital signals TCK1~n and to produce one or more analog signals (OUT A, OUT B) in dependence upon the received digital signal TCK1~n. The digital circuitry (100, 200) is connected to the analog circuitry (14) for applying such a set of digital signals TCK1~n thereto in each processing cycle. The digital circuitry comprises a first circuitry portion (100) which provides the set of digital signals in first processing cycles of the series and a second circuitry portion (200), separate from the first circuitry portion (100), which provides the set of digital signal in second processing cycles of the series different from, and interleaved with, the first processing cycles. Each circuitry portion (100, 200) is operable to perform a predetermined digital processing operation to produce the set of digital signals TCK1~n to be applied to the analog circuitry (14) in a given one of the processing cycles, and the digital processing operations are performed by each circuitry portion with a frequency that is a factor of at least two lower than the processing-cycle frequency.

20 Claims, 11 Drawing Sheets

| BINARY INPUT WORD | | | THERMOMETER-CODED SIGNALS | | | | | | |
|---|---|---|---|---|---|---|---|---|---|
| D3 | D2 | D1 | T7 | T6 | T5 | T4 | T3 | T2 | T1 |
| 0 | 0 | 0 | 0 | 0 | 0 | 0 | 0 | 0 | 0 |
| 0 | 0 | 1 | 0 | 0 | 0 | 0 | 0 | 0 | 1 |
| 0 | 1 | 0 | 0 | 0 | 0 | 0 | 0 | 1 | 1 |
| 0 | 1 | 1 | 0 | 0 | 0 | 0 | 1 | 1 | 1 |
| 1 | 0 | 0 | 0 | 0 | 0 | 1 | 1 | 1 | 1 |
| 1 | 0 | 1 | 0 | 0 | 1 | 1 | 1 | 1 | 1 |
| 1 | 1 | 0 | 0 | 1 | 1 | 1 | 1 | 1 | 1 |
| 1 | 1 | 1 | 1 | 1 | 1 | 1 | 1 | 1 | 1 |

*Fig.2*

□ $IN1{\sim}m\,(t)$

○ $ODD1{\sim}m\,(t) = IN1{\sim}m\,(t-2T)$

× $EVEN1{\sim}m\,(t) = \frac{1}{2}\{IN1{\sim}m\,(t-T) + ODD1{\sim}m\,(t-T)\}$

DATA MULTIPLEXING IN MIXED-SIGNAL CIRCUITRY

BACKGROUND OF THE INVENTION

1. Field of the Invention

The present invention relates to data multiplexing techniques for use in mixed-signal circuitry and integrated circuit devices, for example digital-to-analog converters (DACs). Such mixed-signal circuitry and devices include a mixture of digital circuitry and analog circuitry.

2. Description of the Related Art

FIG. 1 of the accompanying drawings shows parts of a conventional DAC integrated circuit (IC) of the so-called "current-steering" type. The DAC 1 is designed to convert an m-bit digital input word (D1–Dm) into a corresponding analog output signal.

The DAC 1 contains analog circuitry including a plurality (n) of identical current sources $2_1$ to $2_n$, where $n=2^m-1$. Each current source 2 passes a substantially constant current I. The analog circuitry further includes a plurality of differential switching circuits $4_1$ to $4_n$ corresponding respectively to the n current sources $2_1$ to $2_n$. Each differential switching circuit 4 is connected to its corresponding current source 2 and switches the current I produced by the current source either to a first terminal, connected to a first connection line A of the converter, or a second terminal connected to a second connection line B of the converter.

Each differential switching circuit 4 receives one of a plurality of digital control signals T1 to Tn (called "thermometer-coded signals" for reasons explained hereinafter) and selects either its first terminal or its second terminal in accordance with the value of the signal concerned. A first output current $I_A$ of the DAC 1 is the sum of the respective currents delivered to the differential-switching-circuit first terminals, and a second output current $I_B$ of the DAC 1 is the sum of the respective currents delivered to the differential-switching-circuit second terminals.

The analog output signal is the voltage difference $V_A-V_B$ between a voltage $V_A$ produced by sinking the first output current $I_A$ of the DAC 1 into a resistance R and a voltage $V_B$ produced by sinking the second output current $I_B$ of the converter into another resistance R.

In the FIG. 1 DAC the thermometer-coded signals T1 to Tn are derived from the binary input word D1–Dm by digital circuitry including a binary-thermometer decoder 6. The decoder 6 operates as follows.

When the binary input word D1–Dm has the lowest value the thermometer-coded signals T1-Tn are such that each of the differential switching circuits $4_1$ to $4_n$ selects its second terminal so that all of the current sources $2_1$ to $2_n$ are connected to the second connection line B. In this state, $V_A=0$ and $V_B=nIR$. The analog output signal $V_A-V_B=-nIR$.

As the binary input word D1–Dm increases progressively in value, the thermometer-coded signals T1 to Tn produced by the decoder 6 are such that more of the differential switching circuits select their respective first terminals (starting from the differential switching circuit $4_1$) without any differential switching circuit that has already selected its first terminal switching back to its second terminal. When the binary input word D1–Dm has the value i, the first i differential switching circuits $4_1$ to $4_i$ select their respective first terminals, whereas the remaining n-i differential switching circuits $4_{i+1}$ to $4_n$ select their respective second terminals. The analog output signal $V_A-V_B$ is equal to (2i−n)IR.

FIG. 2 of the accompanying drawings shows an example of the thermometer-coded signals generated for a three-bit binary input word D1-D3 (i.e. in this example m=3). In this case, seven thermometer-coded signals T1 to T7 are required ($n=2^m-1=7$).

As FIG. 2 shows, the thermometer-coded signals T1 to Tn generated by the binary-thermometer decoder 6 follow a so-called thermometer code in which it is known that when an rth-order signal Tr is activated (set to "1"), all of the lower-order signals T1 to Tr-1 will also be activated.

Thermometer coding is popular in DACs of the current-steering type because, as the binary input word increases, more current sources are switched to the first connection line A without any current source that is already switched to that line A being switched to the other line B. Accordingly, the input/output characteristic of the DAC is monotonic and the glitch impulse resulting from a change of 1 in the input word is small.

However, when it is desired to operate such a DAC at very high speeds (for example 100 MHz or more), it is found that glitches may occur at one or both of the first and second connection lines A and B, producing a momentary error in the DAC analog output signal $V_A-V_B$. These glitches in the analog output signal may be code-dependent and result in harmonic distortion or even non-harmonic spurs in the output spectrum. Some of the causes of these glitches have been determined to be as follows.

Firstly, the digital circuitry (the binary-thermometer decoder 6 and other digital circuits) is required to switch very quickly and its gate count is quite high. Accordingly, the current consumption of the digital circuitry could be as much as 20 mA per 100 MHz at high operating speeds. This combination of fast switching and high current consumption inevitably introduces a high degree of noise into the power supply lines. Although it has previously been considered to separate the power supplies for the analog circuitry (e.g. the current sources $2_1$ to $2_n$ and differential switching circuits $4_1$ to $4_n$ in FIG. 1) from the power supplies for the digital circuitry, this measure alone is not found to be wholly satisfactory when the highest performance levels are required. In particular, noise arising from the operation of the binary-thermometer decoder 6 can lead to skew in the timing of the changes in the thermometer-coded signals T1 to Tn in response to different changes in the digital input word D1 to Dm. For example, it is estimated that the skew may be several hundreds of picoseconds. This amount of skew causes significant degradation of the performance of the DAC and, moreover, being data-dependent, the degradation is difficult to predict.

Secondly, in order to reduce the skew problem mentioned above, it may be considered to provide a set of latch circuits, corresponding respectively to the thermometer-coded signals T1 to Tn, between the digital circuitry and the analog circuitry, which latches are activated by a common timing signal such that the outputs thereof change simultaneously. However, surprisingly it is found that this measure alone is not wholly effective in removing skew from the thermometer-coded signals. It is found, for example, that data-dependent jitter still remains at the outputs of the latch circuits and that the worst-case jitter increases in approximate proportion to the number of thermometer-coded signals. Thus, with (say) 64 thermometer-coded signals the worst-case jitter may be as much as 20 picoseconds which, when high performance is demanded, is excessively large.

These problems have been addressed in our copending U.S. applications Ser. Nos. 09/227,201 and 09/382,459

(corresponding respectively to United Kingdom patent publication nos. GB-A-2335097 and GB-A-2341287), the entire contents of which are incorporated herein by reference, which disclose DACs having the configuration as shown in FIG. 3 of the accompanying drawings. The FIG. 3 circuitry is divided into three sections: a digital section, a latch section and an analog section. The latch section is interposed between the digital and analog sections.

The digital section comprises decoder circuitry 10, which is connected to other digital circuitry (not shown) to receive an m-bit digital input word D1~Dm. The decoder circuitry 10 has an output stage made up of n digital circuits DC1 to DCn which produce respectively thermometer-coded signals T1 to Tn based on the digital input word, for example in accordance with the table of FIG. 2 discussed hereinbefore.

The latch section comprises a set 12 of n latch circuits L1 to Ln. Each latch circuit is connected to receive an individually-corresponding one of the thermometer-coded signals T1 to Tn produced by the decoder circuitry 10. Each latch circuit L1 to Ln also receives a clock signal CLK. The latch circuits L1 to Ln produce at their outputs respective clocked thermometer signals TCK1 to TCKn that correspond respectively to the thermometer-coded signals T1 to Tn produced by the decoder circuitry 10.

In each cycle of the DAC IC a new sample of the digital input word D1–Dm is taken and so the thermometer-coded signals T1 to Tn normally change from one cycle to the next. In each cycle, it inevitably takes a finite time for these signals to settle to their intended final values from the moment the new sample is taken. Also, inevitably some digital circuits DC1 to DCn will produce their respective thermometer-coded signals earlier than others. By virtue of the clocked operation of the latch circuits L1 to Ln, the clocked thermometer signals TCK1 to TCKn can be prevented from changing until all the thermometer-coded signals T1 to Tn have settled to their intended values for a particular cycle of the DAC.

The analog section comprises a set 14 of n analog circuits AC1 to ACn. Each of the analog circuits AC1 to ACn receives an individually-corresponding one of the clocked thermometer signals TCK1 to TCKn. The analog circuits AC1 to ACn each have one or more analog output terminals and signals produced at the analog output terminals are combined appropriately to produce one or more analog output signals. For example, currents may be summed by summing connection lines as in FIG. 1. Two such analog output signals OUTA and OUTB are shown in FIG. 3 by way of example.

In the FIG. 3 circuitry, each digital circuit DC1 to DCn, together with its corresponding latch circuit L1 to Ln and its corresponding analog circuit AC1 to ACn, constitutes a so-called "cell" of the DAC. Thus, each cell includes a digital circuit DC, a latch circuit L and an analog circuit AC. The digital circuit DC produces a first digital signal (thermometer-coded signal) T for its cell. The latch circuit for the cell receives the first digital signal T and delivers to the analog circuit AC of the cell a second digital signal (clocked thermometer signal) TCK corresponding to the first digital signal T once the first digital signals of all cells have settled to their final intended values. Thus, the latch circuit serves as a signal control circuit for deriving the second digital signal from the first digital signal and controlling the timing of its application to the analog circuit AC. The second digital signal TCK serves as a control signal for use in controlling a predetermined operation of the analog circuit AC of the cell. This predetermined operation may be any suitable type of operation of the cell. For example, it could be a switching or selection operation for switching on or off, or controlling the output path of, an analog output signal of the cell.

However, with such a configuration as described above, as attempts are made to increase the sampling rate of such a DAC (e.g. to 1 Gsamples/s), it becomes increasingly difficult to control the latching of the selection signals T1 to Tn reliably. This may be partly because of problems associated with distributing the very fast clock signal CLK so that it arrives simultaneously at all the latches, and partly because the decoder circuitry itself may not be able to operate fast enough at such high sampling rates.

SUMMARY OF THE INVENTION

According to a first aspect of the present invention there is provided mixed-signal circuitry, operative repetitively to perform a series of processing cycles, comprising: analog circuitry operable in each said processing cycle to receive a digital signal and to produce one or more analog signals in dependence upon the received digital signal; and digital circuitry, connected to said analog circuitry for applying such a digital signal thereto in each said processing cycle, and comprising a first circuitry portion which provides said digital signal in first processing cycles of said series and a second circuitry portion, separate from said first circuitry portion, which provides said digital signal in second processing cycles of said series different from, and interleaved with, said first processing cycles, each said circuitry portion being operable to perform a predetermined digital processing operation to produce the digital signal to be applied to the analog circuitry in a given one of said processing cycles, and said digital processing operations being performed by each said circuitry portion with a frequency that is a factor of at least two lower than the processing-cycle frequency.

By providing two circuitry portions instead of one, with each circuitry portion providing the digital signals in different ones of the processing cycles which are then interleaved, it is possible to operate the circuitry portions at a frequency which is lower than the processing cycle frequency. This has the advantage of alleviating timing problems associated with distributing a very fast clock signal around circuitry, and allows the circuitry portions to be of simpler design as they can operate more slowly than the processing cycle frequency, which in turn has the possible advantage of reducing the overall power consumption of the mixed-signal circuitry.

According to a second aspect of the present invention there is provided digital-to-analog conversion circuitry, operative repetitively to perform a series of processing cycles, comprising: analog circuitry operable in each said processing cycle to receive a digital signal and to produce one or more analog signals in dependence upon the received digital signal; and digital circuitry, connected to said analog circuitry for applying such a digital signal thereto in each said processing cycle, and comprising a first circuitry portion which provides said digital signal in first processing cycles of said series and a second circuitry portion, separate from said first circuitry portion, which provides said digital signal in second processing cycles of said series different from, and interleaved with, said first processing cycles, each said circuitry portion being operable to perform a predetermined digital processing operation to produce the digital signal to be applied to the analog circuitry in a given one of said processing cycles, and said digital processing operations being performed by each said circuitry portion with a frequency that is a factor of at least two lower than the processing-cycle frequency.

With such digital-to-analog conversion circuitry each of the circuitry portions does not require to have its own set of input pins for receiving said items of data. One set of input pins may be provided to supply the digital interpolation filter means with digital input words from which the items of data supplied separately to each of the circuitry portions may be derived.

BRIEF DESCRIPTION OF THE DRAWINGS

FIG. 2, also discussed hereinbefore, presents a table showing thermometer-coded signals derived from a binary input word;

DETAILED DESCRIPTION OF THE PREFERRED EMBODIMENTS

Figure 3:
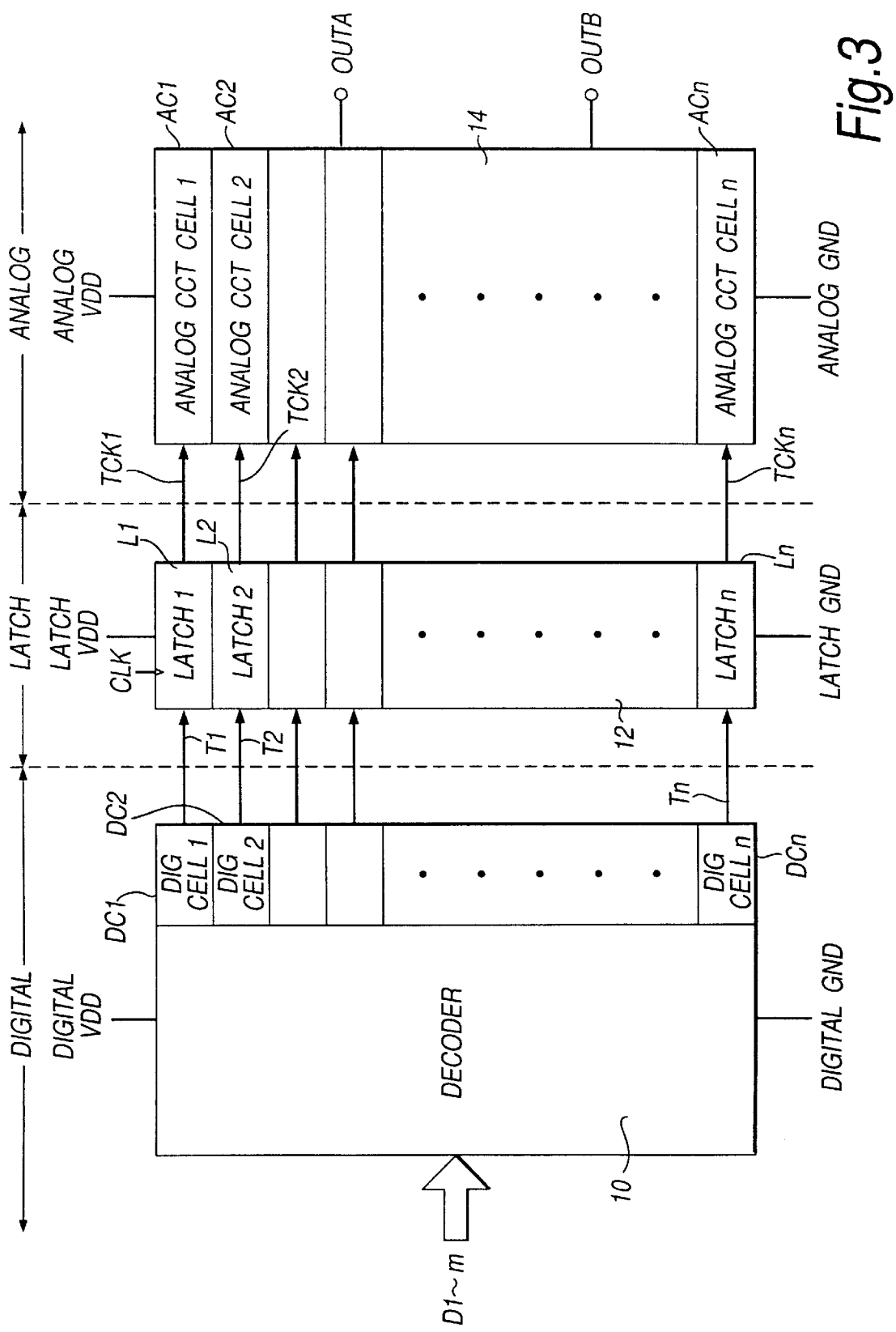
FIG. 3, also discussed hereinbefore, shows parts of further DAC circuitry.
Figure 4A:
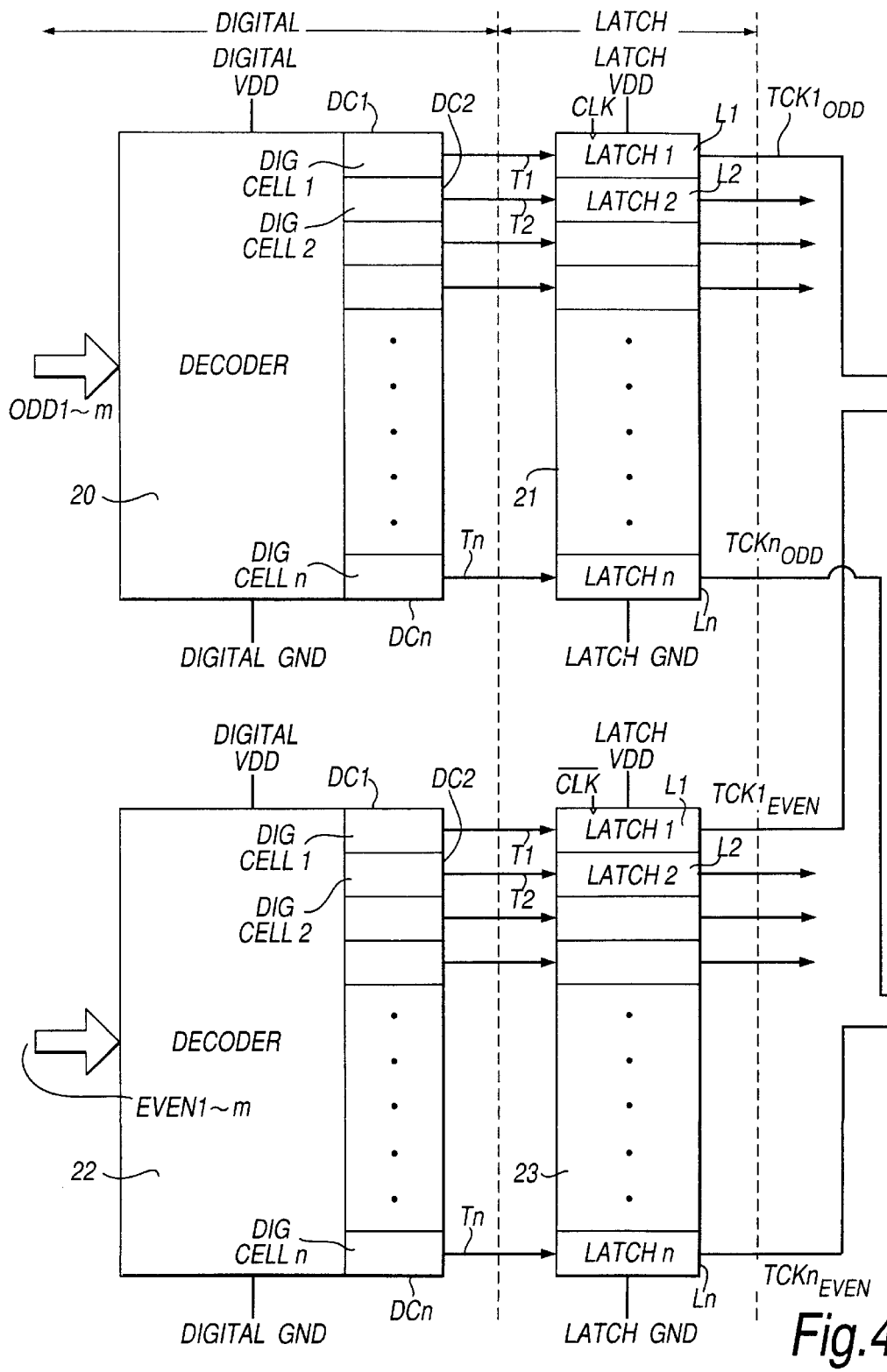
FIGS. 4A and 4B show parts of DAC circuitry embodying the present invention.
Figure 4B:
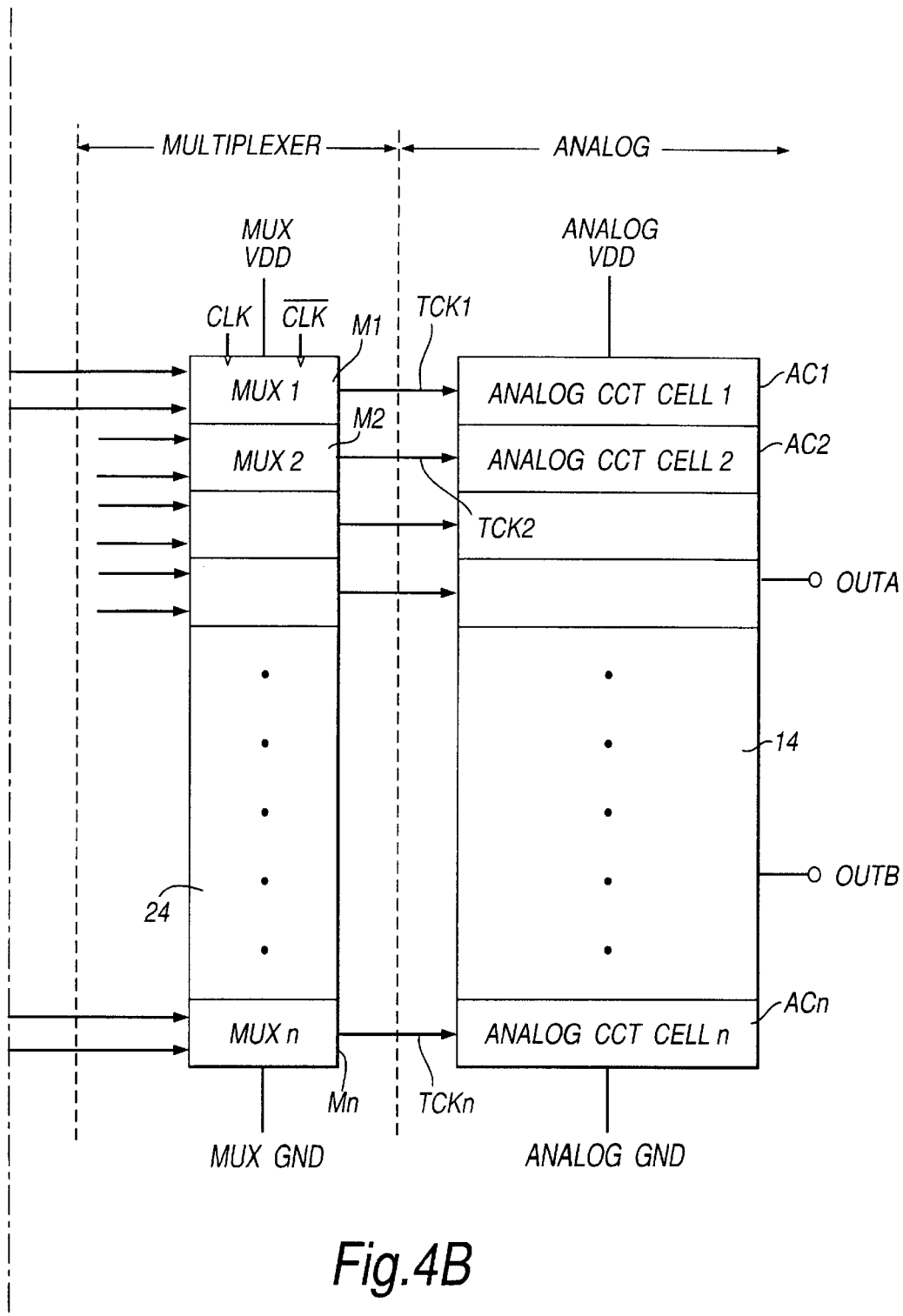

FIGS. 4A and 4B show parts of a DAC IC embodying the present invention. In FIGS. 4A and 4B parts of the DAC IC that are the same as, or correspond closely to, parts of the FIG. 3 DAC IC described above are denoted by the same reference numerals.

In the FIGS. 4A and 4B circuitry the digital section comprises two decoder circuitry portions 20 and 22, rather than the single decoder circuitry portion 10 of FIG. 3. The two decoder circuitry portions 20 and 22 of FIGS. 4A and 4B have the same constitution as one another.

The first decoder circuitry portion 20 is connected to other digital circuitry (not shown) to receive an m-bit digital input word ODD1~m, and the second decoder circuitry portion 22 is connected to other digital circuitry (not shown) to receive an m-bit digital input word EVEN1~m. Each decoder circuitry portion 20 and 22 has an output stage made up of n digital circuits DC1 to DCn which produce respective thermometer-coded signals T1 to Tn based on the digital input word, for example in accordance with the table of FIG. 2 discussed hereinbefore.

The latch section of the FIGS. 4A and 4B circuitry is also divided into two latch circuitry portions 21 and 23, corresponding respectively to decoder circuitry portions 20 and 22. Each latch section comprises a set of n latch circuits L1 to Ln. Each latch circuit L1 to Ln is connected to receive an individually-corresponding one of the thermometer-coded signals T1 to Tn produced by its corresponding decoder circuitry portion 20 or 22. The first latch circuitry portion 21 also receives at its clock input a clock signal CLK, and the second latch circuitry portion 23 receives at its clock input a complementary clock signal $\overline{CLK}$.

The latch circuits L1 to Ln of the first latch circuitry portion 21 produce at their outputs respective clocked thermometer signals $TCK1_{ODD}$ to $TCKn_{ODD}$ that correspond respectively to the thermometer-coded signals T1 to Tn produced by the first decoder circuitry portion 20. The latch circuits L1 to Ln of the second latch circuitry portion 23 produce at their outputs respective clocked thermometer signals $TCK1_{EVEN}$ to $TCKn_{EVEN}$ that correspond respectively to the thermometer-coded signals T1 to Tn produced by the second decoder circuitry portion 22.

The FIGS. 4A and 4B circuitry further includes a multiplexer section which comprises a set 24 of n multiplexer circuits M1 to Mn. Each of the multiplexer circuits is connected to receive a pair of corresponding clocked thermometer signals from the latch circuitry portions 21 and 23, the first signal of the pair being provided by the first latch circuitry portion 21 and the second signal of the pair being provided by the second latch circuitry portion 23. For example, the multiplexer circuit M1 receives its first corresponding clocked thermometer signal $TCK1_{ODD}$ from the latch circuit L1 of the first latch circuitry portion 21, and its second $TCK1_{EVEN}$ from corresponding clocked thermometer signal latch circuit L1 of the second latch circuitry the portion 23. The multiplexer circuits M1 to Mn produce at their outputs respective clocked thermometer signals TCK1 to TCKn. These clocked thermometer signals TCK1 to TCKn correspond to the above-described clocked thermometer signals TCK1 to TCKn of FIG. 3, and the analog section of FIGS. 4A and 4B is the same as the FIG. 3 analog section.

In the FIGS. 4A and 4B DAC, instead of receiving a single stream of digital input signals D1~m (as in the FIG. 3 DAC), the digital input signals D1~m to be converted are divided into alternate odd and even input signals ODD1~m and EVEN1~m, each having half the frequency f of the input signals D1~m. Thus, successive conversion cycles of the FIGS. 4A and 4B DAC are divided into alternative odd and even cycles, and the digital input signals D1~m in odd cycles constitute the odd input signals ODD1~m respectively and the digital input signals D1~m in even cycles constitute the even input signals EVEN1~m respectively. The division is carried out externally of the DAC circuitry, for example in a pre-processing stage such as a digital interpolation filtering stage (described below) which may be on- or off-chip.

The decoder circuitry portion 20 and its corresponding latch circuitry portion 21 operate in a similar manner to the decoder circuitry portion 10 and the latch section 12 of FIG. 3, but receive only the odd input signals ODD1~m. Similarly, the decoder circuitry portion 22 and its corresponding latch circuitry portion 23 operate in a similar manner to the decoder circuitry portion 10 and the latch section 12 of FIG. 3, but receive only the even input signals EVEN1~m. In this way, each decoder circuitry portion 20 or 22 operates at half the conversion-cycle frequency f of the DAC, making decoding possible at very high conversion-cycle frequencies. Also, the latches need only be clocked at half the conversion-cycle frequency, thus reducing the above-described problems associated with a very fast clock signal (e.g. up to 1 GHz).

Detailed operation of DAC circuitry embodying the invention will be described below with reference to FIG. 7.

Figure 5:
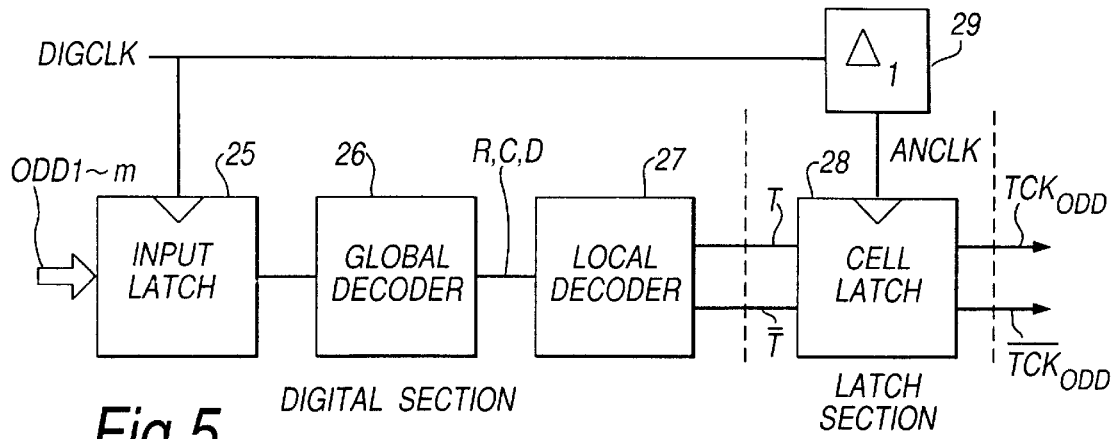
FIG. 5 shows an example constitution of digital circuitry in the FIGS. 4A and 4B DAC circuitry.

FIG. 5 shows an example of the circuitry in each decoder circuitry portion 20/22 and each latch circuitry portion 21/23 of the FIGS. 4A and 4B DAC. For the sake of simplicity, only the circuitry of one cell is illustrated in FIG. 5. Also, as the two decoder circuitry portions are identically-constituted and the two latch circuitry portions are also identically-constituted, only the constitutions of the first decoder circuitry portion 20 and the first latch circuitry portion 21 are described here.

The decoder circuitry portion 20 (part of the digital section) includes an input latch 25 connected for receiving the odd input word ODD1~m. The input latch 25 also receives a clock signal DIGCLK which is, for example, an externally-applied signal. The input latch 25 may be of the positive edge-triggered D-type, for example.

The decoder circuitry portion 20 also comprises respective global and local decoders 26 and 27. The global decoder 26 receives the input word ODD1–Dm from the latch 25 and decodes it into two or more sets (or dimensions) of thermometer-coded signals (referred to as row and column signals, or row, column and depth signals). These two or more sets of signals are delivered to a plurality of local decoders which correspond respectively to the cells, only one of these local decoders is shown in FIG. 5. Each local decoder only needs to receive and decode a small number (2 or 3) of the signals in the sets produced by the global decoder. The local decoders can be regarded as arranged logically (not necessarily physically as well) in two or more dimensions corresponding respectively to the sets of thermometer-coded signals. The local decoders are effectively addressed by the sets of thermometer-coded signals and, using simple combinatorial logic, derive respective "local" thermometer-coded signals T for their respective cells.

Thus, in FIG. 5 the particular local decoder 27 is connected to receive a small number (represented schematically by respective row, column and depth signals R, C, D) of the signals in the sets of row, column and depth signals produced by the global decoder 26. The local decoder 27 derives complementary thermometer-coded signals T and $\overline{T}$ for its particular cell based on the received R, C and D signals. Further details of such "two-stage" thermometer-decoding involving global and local decoders may be found, for example, in our co-pending United States patent application Ser. No. 09/227,200 (corresponding to United Kingdom patent publication no. GB-A-2333171), the entire content of which is incorporated herein by reference.

The latch circuitry portion 21 (part of the latch section) comprises a cell latch 28 which is of the differential type having its two data inputs connected respectively to the outputs of the local decoder 27 for receiving therefrom the thermometer-coded complementary output signals T and $\overline{T}$. The cell latch 28 is of the positive edge-triggered D-type, for example, and receives at its clock input a clock signal ANCLK. The ANCLK signal is derived from the externally-applied DIGCLK signal by a delay element 29 which imposes a nominally-fixed delay $\Delta_1$ (which may be zero) on the received DIGCLK signal.

The outputs of the cell latch 28 produce respective complementary clocked thermometer-coded signals TCK$_{ODD}$ and $\overline{TCK}_{ODD}$ corresponding respectively to the T and $\overline{T}$ signals. These signals TCK$_{ODD}$ and $\overline{TCK}_{ODD}$ are supplied to the multiplexer circuitry 24 (FIGS. 4A and 4B).

Next, an example of the constitution of the multiplexer circuitry 24 in the FIGS. 4A and 4B DAC will be described.

Figure 6:
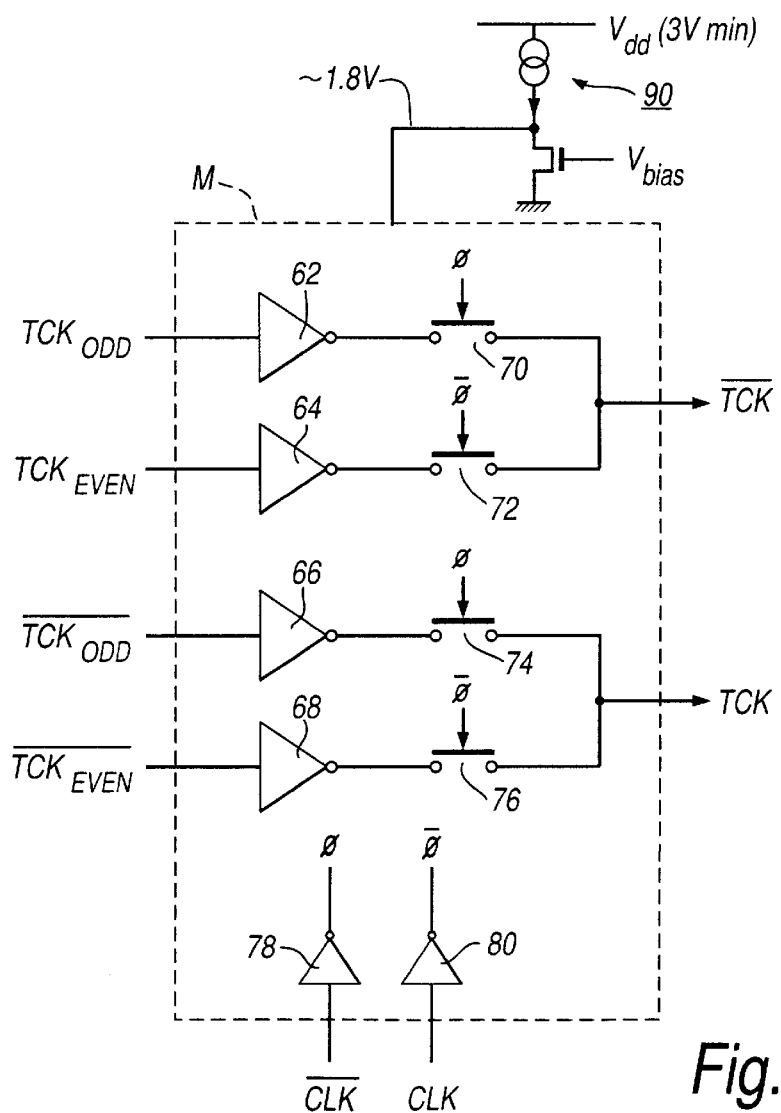
FIG. 6 shows an example constitution of multiplexer circuitry in the FIGS. 4A and 4B DAC IC.

The multiplexer circuitry 24 has n multiplexers M1 to Mn. As shown in FIG. 6, each multiplexer circuit M comprises four inverting input buffers 62, 64, 66 and 68, four selection switches 70, 72, 74 and 76, and two clock buffers 78 and 80. The input buffers 62 to 68 receive respectively the clocked thermometer-coded signals TCK$_{ODD}$, TCK$_{EVEN}$, $\overline{TCK}_{ODD}$ and $\overline{TCK}_{EVEN}$ and invert the received signals which are then supplied to inputs of the respective ones of the selection switches 70 to 76. Respective outputs of the switches 70 and 72 are connected together to a first output of the multiplexer circuit M, and respective outputs of the switches 74 to 76 are connected together to a second output of the multiplexer circuit M.

The switches 70 and 74 receive a first internal clock signal $\phi$ of the multiplexer circuit M and the switches 72 and 76 receive a second internal clock signal $\overline{\phi}$ of the multiplexer circuit M. The first and second internal clock signals $\phi$ and $\overline{\phi}$ are produced respectively by the clock buffers 78 and 80 which receive the mutually-complementary clock signals CLK and $\overline{CLK}$ and invert them.

Each switch is turned ON when its received internal clock signal has the high logic level (H), and is otherwise turned OFF. When CLK is high (H), $\phi$=H and $\overline{\phi}$=L, the switches 70 and 74 are ON and the switches 72 and 76 are OFF, so TCK$_{ODD}$ is selected as the output $\overline{TCK}$ and $\overline{TCK}_{ODD}$ is selected as the output TCK. When CLK is low (L), $\phi$=L and $\overline{\phi}$=H, the switches 70 and 74 are OFF and the switches 72 and 76 are ON, so TCK$_{EVEN}$ and $\overline{TCK}_{EVEN}$ are selected respectively as the outputs $\overline{TCK}$ and TCK.

Figure 1:
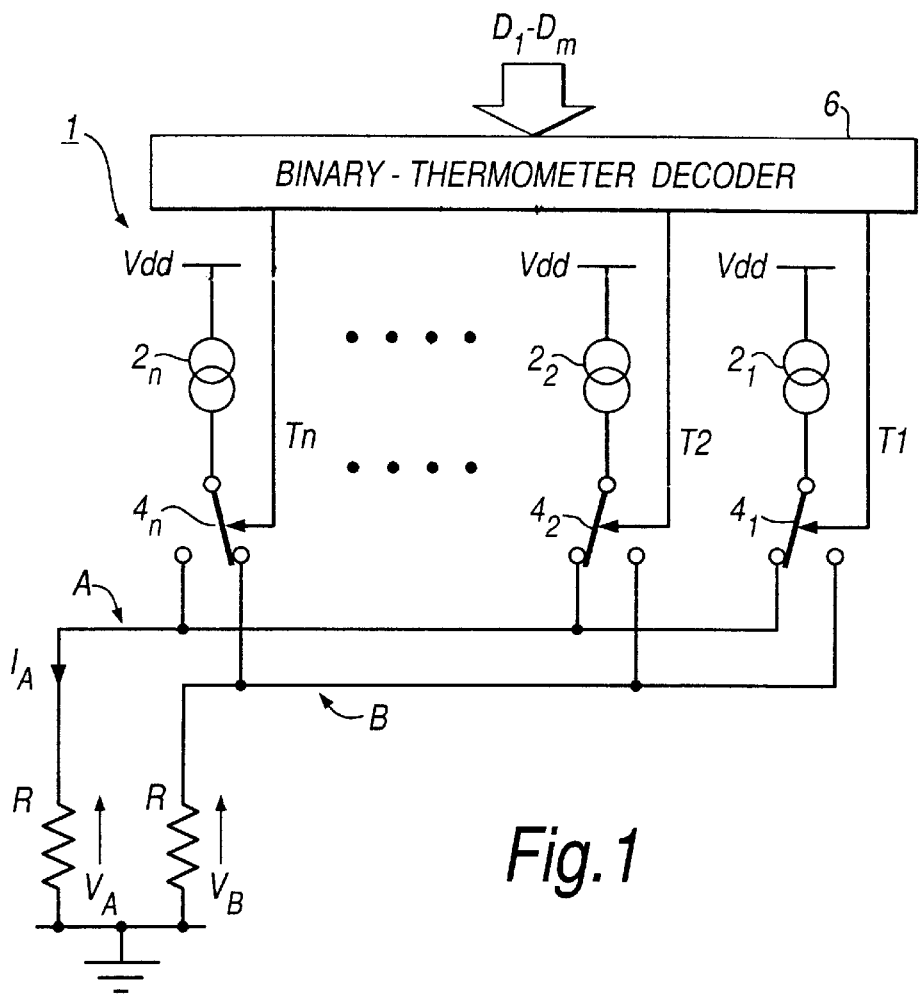
FIG. 1, discussed hereinbefore, shows parts of conventional DAC circuitry.

Incidentally, the signals TCK$_{EVEN}$, TCK$_{ODD}$ and TCK are each advantageously complementary signal pairs to reduce the effects of parasitic capacitances between their conduction lines and the substrate and to provide complementary signals to the analog circuits (switch drivers 4 in FIG. 1).

The clock signals CLK and $\overline{CLK}$ are buffered locally in each multiplexer to reduce loading on the clock distribution lines.

Figure 7:
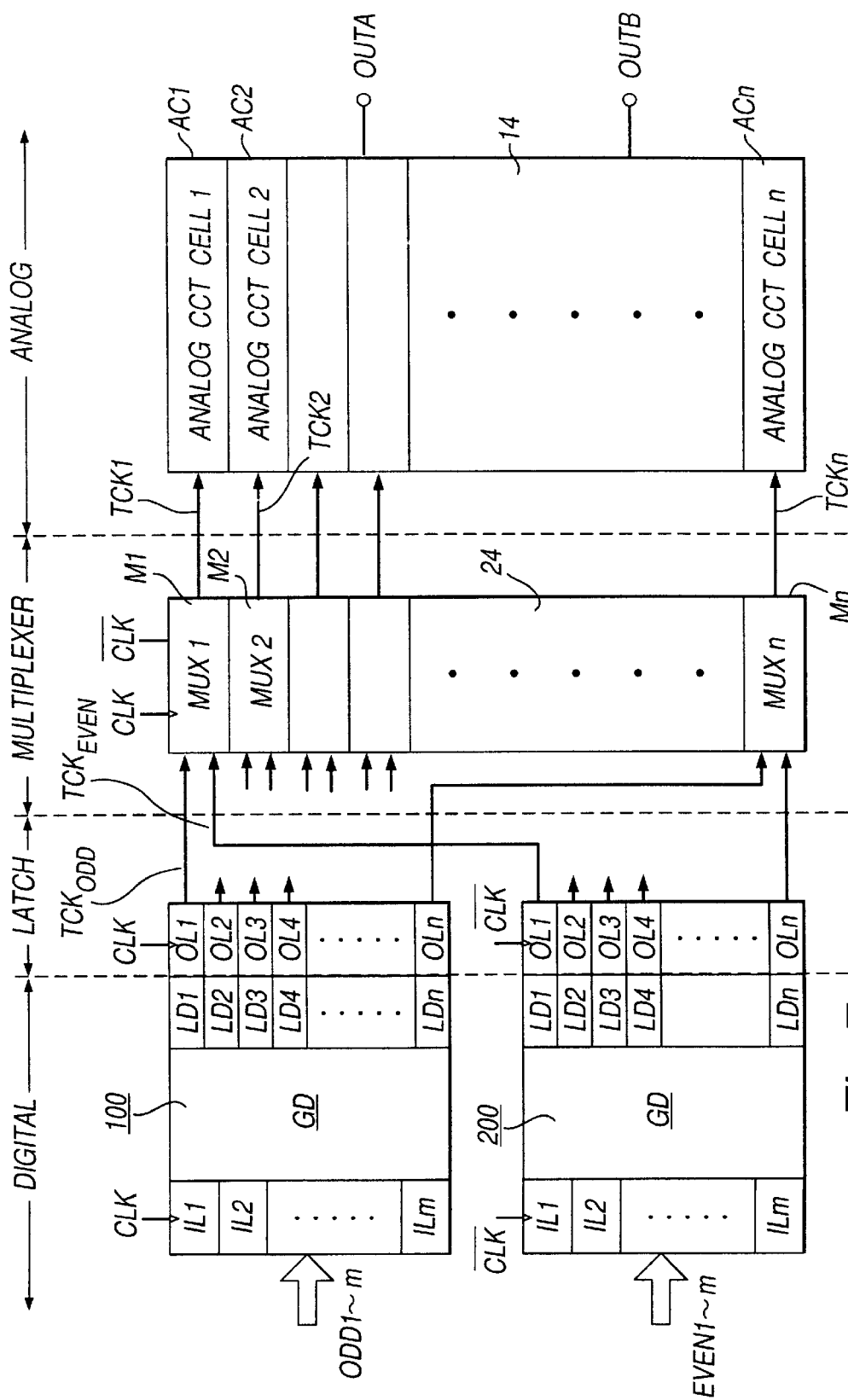
FIG. 7 shows parts of a DAC circuitry in an embodiment based on the FIGS. 5 and 6 constitutions.

FIG. 7 shows the overall constitution of the DAC circuitry using the configuration described with reference to FIGS. 5 and 6. For simplicity, the circuitry preceding the multiplexer section is shown divided up into two different circuit portions 100 and 200. Each circuit portion 100 or 200 is constituted in accordance with FIG. 5 and has m input latches IL1 to ILm (together constituting the input latch 25 in FIG. 5), a global decoder GD (part 26 in FIG. 5), n local decoders LD1 to LDn (each corresponding to the part 27 in FIG. 5), and n output latches OL1 to OLn (each corresponding to the part 28 in FIG. 5).

Incidentally, although the output latches OL1 to OLn are shown as being included in the same circuit portion as other digital circuitry such as the global and local decoders GD and LD1 to LDn, the output latches may be supplied from a separate power supply from that other digital circuitry, in order to reduce power-supply-dependent jitter in the thermometer-coded signals applied to the analog circuitry.

Figure 8:
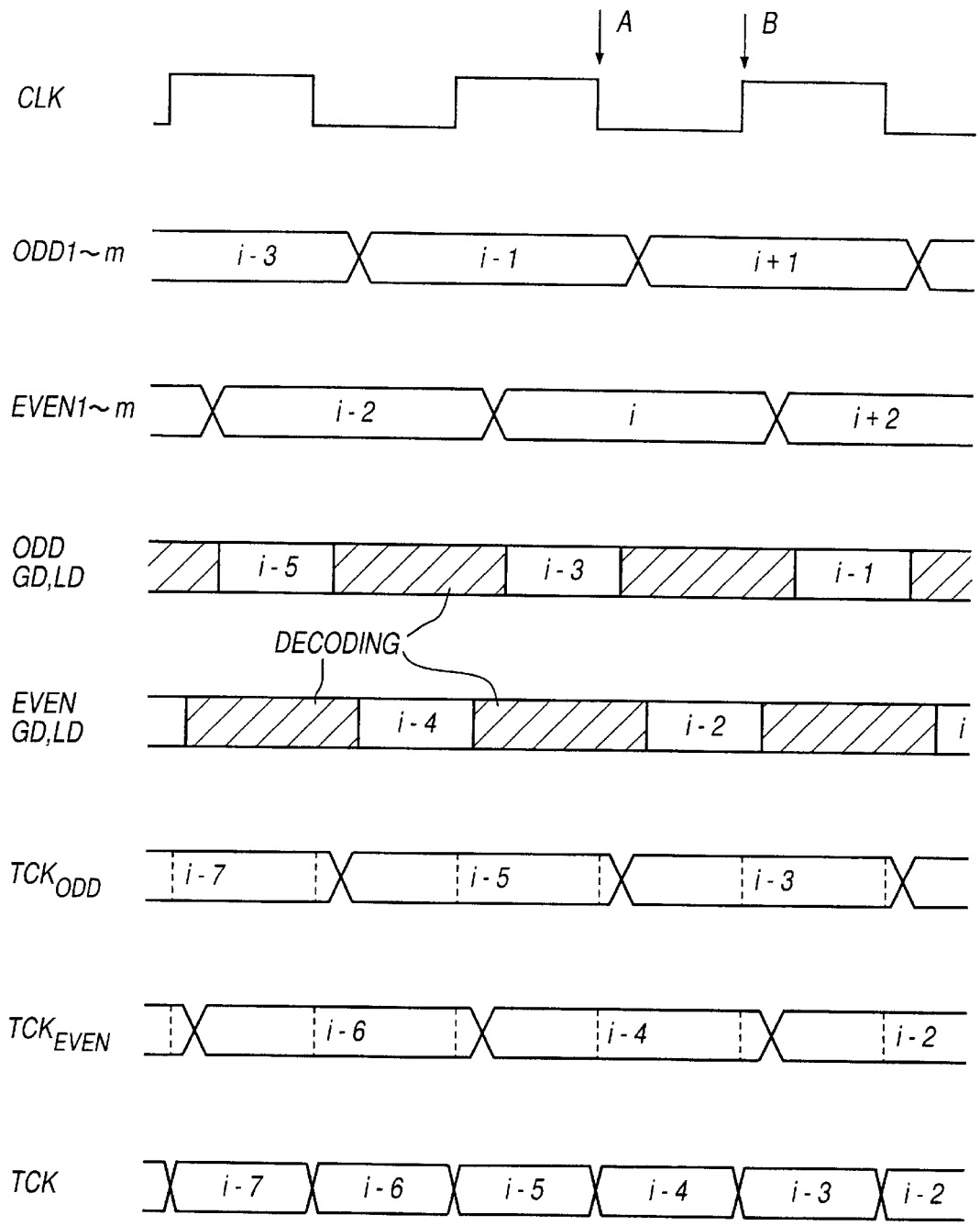
FIG. 8 shows a timing diagram for use in explaining the operation of the FIG. 6 DAC circuitry.

Operation of the FIG. 7 circuitry will now be described with reference to FIG. 8.

Advantageously each multiplexer circuit M has its own independent constant-current power supply 90 so that no data-dependent current is taken from the power supply (Vdd in FIG. 6 may be the Analog Vdd line or a further Vdd line, separate from the Analog Vdd line).

As described previously, the DAC operates at a conversion-cycle frequency f. The digital input signals to be converted are divided into alternate odd and even input signals ODD1~m and EVEN1~m, each having half the frequency f. The circuit portion 100 receives and decodes the odd input signals ODD1~m, and (separately) the circuit portion 200 receives and decodes the even signals EVEN1~m. The DAC's internal clock signal CLK (and its complement $\overline{CLK}$) runs at f/2. At each falling edge of CLK, two operations occur in the odd circuit portion 100. Firstly, a new set of the odd input signals ODD1~m is latched by the input latches IL1~m, and the global and local decoders GD and LD commence a decoding operation to decode the latched input signals. Secondly, the results of the decoding operation performed on the immediately-preceding set of odd input signals are latched by the output latches OL1~n. For example, in FIG. 8 at time A the set i–1 of odd input signals is latched by the input latches, and the decoded signals $TCK_{ODD}$, reflecting the results of the decoding operation on the immediately-preceding set i–3, are latched by the output latches OL1~n.

In the even circuit portion 200 the same operations happen, but in this case on the rising edge of the clock signal CLK (because the input and output latches IL and OL in the even circuit portion receive the complementary clock signal $\overline{CLK}$ instead of CLK itself). For example, at time B the set i of even signals is latched by the input latches, and the decoded signals $TCK_{EVEN}$, reflecting the results of the decoding operation on the immediately-preceding set i–2, are latched by the output latches.

As also shown in FIG. 6, each multiplexer M1 to Mn selects the signal $TCK_{ODD}$ produced by its corresponding output latch OL in the odd circuit portion 20 when CLK is high and selects the signal $TCK_{EVEN}$ produced by its corresponding output latch OL in the even circuit portion 22 when CLK is low. Thus, the analog circuitry receives the TCK signals at the frequency f, even though the internal clock signals operate at only f/2. This is an important advantage in terms of clock distribution as, by making the multiplexer circuitry responsive to both clock edges, the maximum clock frequency requiring distribution is f/2 even though the processing-cycle frequency still is f.

Figure 9A:
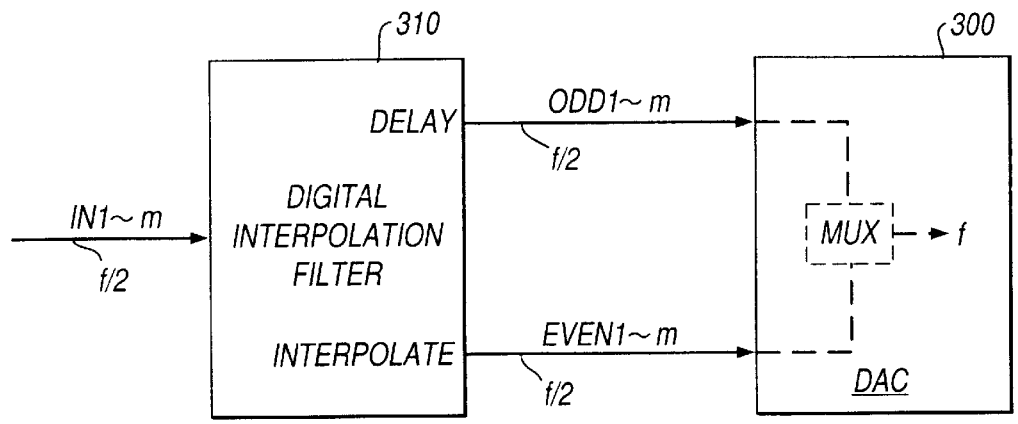
FIG. 9 shows a block diagram for use in explaining how a digital interpolation filter can be used to produce input signals for the FIG. 6 DAC circuitry.

FIG. 9(A) illustrates the way in which a digital interpolation filter 310 can be used with a DAC 300 embodying the present invention to generate odd signals ODD1~m and even signals EVEN1~m from a single input stream of digital data IN1~m. The digital interpolation filter 310 has an input at which input data samples IN1~m are received at a frequency of f/2, where f is the conversion-cycle frequency of the DAC 300. The digital interpolation filter also has first and second outputs DELAY and INTERPOLATE. The DAC 300 has first and second inputs connected respectively to the DELAY and INTERPOLATE outputs for receiving therefrom odd input signals ODD1~m and even input signals EVEN1~m. The odd input signals ODD1~m have a frequency of f/2, and the even input signals EVEN1~m also have a frequency of f/2.

Figure 9B:
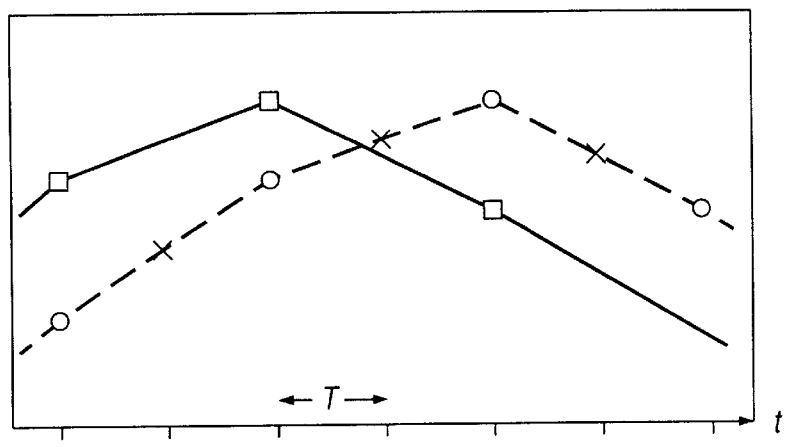

The way in which the odd and even input signals are generated by the digital interpolation filter is shown in FIG. 9(B).

As shown in FIG. 9(B), the input-signal samples IN1~m are received at time intervals of 2T, where T=1/f. For each received sample of a first output sample is produced a time 2T later at the DELAY output of the digital interpolation filter 310. Thus, the output sample at time t is produced by outputting the input sample received at time (t−2T), i.e. each sample of ODD1~m is just a sample of IN1~m delayed by a time 2T. At time t+T a second output sample is produced at the INTERPOLATE output by averaging the input-signal sample received at time t and the first output sample produced at time t.

It will be appreciated that the digital interpolation filter and DAC could be produced on the same chip. This has the advantage of reducing the pin count of the combined circuitry, as only a single m-bit wide interface is needed in this case, as compared to two m-bit wide interfaces for both the filter and the DAC if implemented as separate devices.

Figure 10:
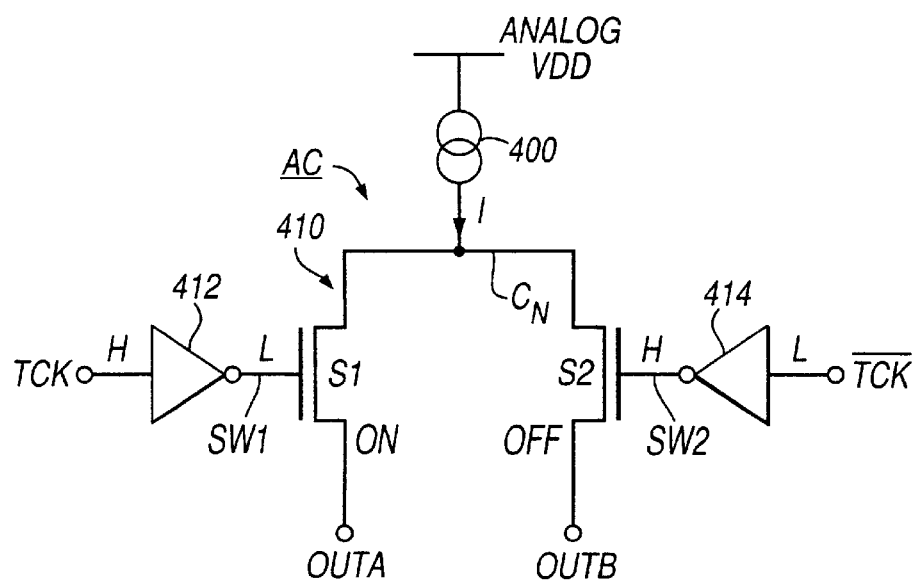
FIG. 10 shows a circuit diagram of an analog circuit suitable for use in DAC circuitry embodying the present invention.

FIG. 10 shows parts of an exemplary analog circuit AC of one cell of the FIG. 6 circuitry. The analog circuit AC comprises a constant-current source 400 and a differential switching circuit 410. The differential switching circuit 410 comprises first and second PMOS field-effect-transistors (FETs) S1 and S2. The respective sources of the transistors S1 and S2 are connected to a common node CN to which the current source 400 is also connected. The respective drains of the transistors S1 and S2 are connected to respective first and second summing output terminals OUTA and OUTB of the circuit. In this embodiment, the output terminals OUTA of all cells are connected together and the respective output terminals OUTB of the cells are connected together.

Each transistor S1 and S2 has a corresponding driver circuit 412 and 414 connected to its gate. The thermometer signals TCK and $\overline{TCK}$ produced by the multiplexer circuit M of the cell (FIG. 6) are applied respectively to inputs of the driver circuits 412 and 414. Each driver circuit buffers and inverts its received input signal TCK or $\overline{TCK}$ to produce a switching signal SW1 or SW2 for its associated transistor Si or S2 such that, in the steady-state condition, one of the transistors S1 and S2 is on and the other is off. For example, as indicated in FIG. 10 itself, when the input signal TS has the high level (H) and the input signal $\overline{TCK}$ has the low level (L), the switching signal SW1 (gate drive voltage) for the transistor S1 is at the low level L causing that transistor be ON, whereas the switching signal SW2 (gate drive voltage) for the transistor S2 is at the high level H, causing that transistor to be OFF. Thus, in this condition, all of the current I flowing into the common node CN is passed to the first output terminal OUTA and no current passes to the second output terminal OUTB.

When the input signals TCK and $\overline{TCK}$ undergo complementary changes from the state shown in FIG. 10, the transistor S1 turns OFF at the same time that the transistor S2 turns ON.

It will be appreciated that many other designs of analog circuit can be used. For example, other differential switching circuits are described in our co-pending U.S. patent application Ser. No. 09/227,202 (corresponding to United Kingdom patent publication no. GB-A-2333191), the entire content of which is incorporated herein by reference, and other cell arrays for use in DAC ICs and other mixed-signal ICs are described in our co-pending U.S. patent application Ser. No. 09/137,837 (corresponding to United Kingdom patent publication no. 2333190), the entire content of which is incorporated herein by reference.

As shown in FIGS. 4A and 4B, each section of the circuitry (digital, latch, multiplexer and analog) preferably has its own independent power supply connections, for example a positive power supply potential VDD and a negative power supply potential or electrical ground GND. Thus, the digital section has a DIGITAL VDD and a DIGITAL GND; the latch section has a LATCH VDD and a LATCH GND; the multiplexer section has a MUX VDD and a MUX GND; and the analog section has an ANALOG VDD and ANALOG GND. These different VDD and GND supplies are received at different respective power supply pins of the DAC IC (chip). Thus, if desired the potentials of the supplies to each section can be different from one another.

Typically, however, for convenience a single power supply will be used off-chip to provide the power supplies for each of the different sections, and a circuit board on which the chip is mounted will contain suitable circuitry for delivering the different power supplies to the appropriate power supply pins of the chip whilst decoupling the different supplies from one another using inductance and capacitance elements in known manner.

It is not essential to supply power independently to the different circuitry sections (digital, latch, multiplexer and analog). A common power supply can be used for all sections, if desired.

Within the integrated circuit itself, there are a number of ways in which coupling between the power supplies of the different sections can be prevented. Details of these are provided in our co-pending U.S. patent application Ser. No. 09/227,201 (corresponding to United Kingdom patent publication no. GB-A-2335097), the entire content of which is incorporated herein by reference.

It is not essential in any of the foregoing embodiments that the digital circuitry (e.g. 100 and 200 in FIG. 6) produces thermometer-coded signals. The analog circuits could, for example, be selected individually in accordance with the digital signals produced by the digital circuitry, rather than combinatorially as in the case in which thermometer-coded signals are used. Thus, the digital signals produced by the digital circuitry could be mutually-exclusive selection signals.

The principle of the invention can be extended to more than two circuit portions, although in this case, at least one further internal clock signal, in addition to the basic clock signal and its complement, would be required. Lower power consumption is achieved by providing the decoder circuitry as n circuit portions and operating them in parallel at f/n than by using a single set of the circuitry operating at f, because the n circuit portions can be of simpler design as they can operate more slowly.

Figure 11:
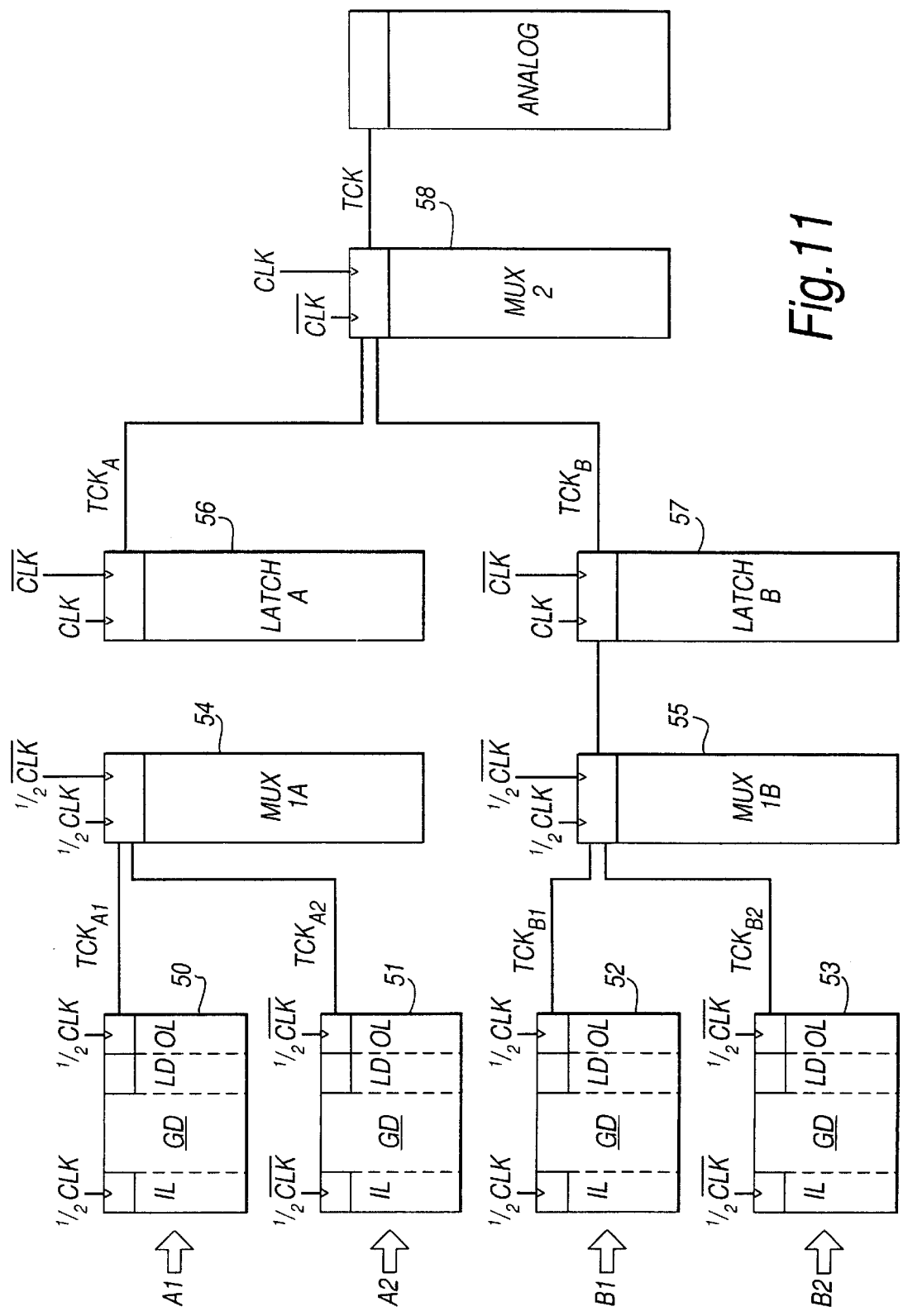
FIG. 11 shows parts of DAC circuitry in another embodiment of the present invention.

FIG. 11 shows an example where four circuit portions 50, 51, 52 and 53 are used in parallel, instead of the two circuit portions 100 and 200 of the above-described FIG. 7 embodiment. Each of the four circuit portions 50, 51, 52 and 53 is of a similar construction to that of each of the circuit portions 100 and 200 of FIG. 7, consisting of a set of input latches IL, a global decoder GD, a set of local decoders LD, and a set of output latches OL. For simplicity, in FIG. 11 only the first cell of each set is illustrated.

As before, the DAC operates at a conversion-cycle frequency of f. The digital input signals to be converted are now divided into four signals, labelled here as A1, A2, B1 and B2, each having a quarter the frequency f. The first circuit portion 50 receives and decodes input signals A1, the second circuit portion 51 receives and decodes input signals A2, the third circuit portion 52 receives and decodes input signals B1 and the fourth circuit portion 53 receives and decodes input signals B2. The time sequence of input signals in this embodiment is A1→B1→A2→B2→A1 etc. The input latches IL and output latches OL are clocked at a frequency f/4.

In addition to a second-stage multiplexer circuitry portion 58 (MUX2), two further first-stage multiplexer circuit portions 54 and 55 (MUX1A and MUX1B respectively) are required in this embodiment. The construction and operation of each of MUX1A, MUX1B, and MUX2 is similar to the construction and operation of the multiplexer circuit portion 24 of the FIG. 7 embodiment. A further latch circuitry portion 54 (LATCH A) is provided to latch the outputs of MUX1A, and a further latch circuitry portion 55 (LATCH B) is provided to latch the outputs of MUX1B.

In the present embodiment, MUX2 receives and multiplexes alternating decoded signals $TCK_A$ and $TCK_B$ output from MUX1A and MUX1B respectively (via re-latching circuitry portions LATCH A and LATCH B). In turn, MUX1A receives and multiplexes alternating decoded signals $TCK_{A1}$ and $TCK_{A2}$ output from the first and second circuit portions 50 and 51 respectively, while MUX1B receives and multiplexes alternating decoded signals $TCK_{B1}$ and $TCK_{B2}$ output from the third and fourth circuit portions 52 and 53 respectively. Both MUX1A and MUX1B are clocked at a frequency f/4 (½CLK), while MUX2 and latches LATCH A and LATCH B are clocked at a frequency f/2 (CLK). The clock signal ½CLK may be produced from CLK by a frequency divider.

The embodiment of FIG. 11 may conceptually be considered to be divided into three "parts". Each part consists of two parallel latch circuitry portions having a set of n latch circuits with outputs clocked at a frequency F, with latch outputs being fed into a single multiplexer circuitry portion having a set of n multiplexer circuits also clocked at a frequency F. The n outputs of the multiplexer circuitry portion are then fed into the next stage which operates at frequency 2F.

With this in mind, the first such "part" of the FIG. 11 circuitry consists of the two output latch circuitry portions OL of first circuitry portion 50 and second circuitry portion 51, together with MUX1A. The second such "part" of the FIG. 11 circuitry consists of the two output latch circuitry portions OL of third circuitry portion 52 and fourth circuitry portion 53, together with MUX1B. The third such "part" of the FIG. 11 circuitry consists of the two latch circuitry portions LATCH A and LATCH B, together with MUX2.

It will therefore be appreciated that it is possible to chain together such "parts" iteratively in any desired number of stages.

Note that is preferable, but not essential, to provide the latch circuitry portions which are disposed between the multiplexer circuitry portions. For example, it is possible in the FIG. 11 circuitry to dispense with the latch circuitry portions LATCH A and LATCH B so long as appropriate precautions are taken to ensure a satisfactory timing relationship between clocks ½CLK and CLK (and their complementary signals).

Note that in the above-described embodiments of the present invention, both edges of the clock are used to clock decoded digital data into the analog section. For this reason it is important to have a clock which has a substantially 50% duty cycle. A further reason is that with a high clock rate and a significantly unbalanced duty cycle clock, certain parts of the circuitry (e.g. decoder portions) may not have time to operate and produce settled outputs in the shorter portion of the clock cycle.

Figure 12:
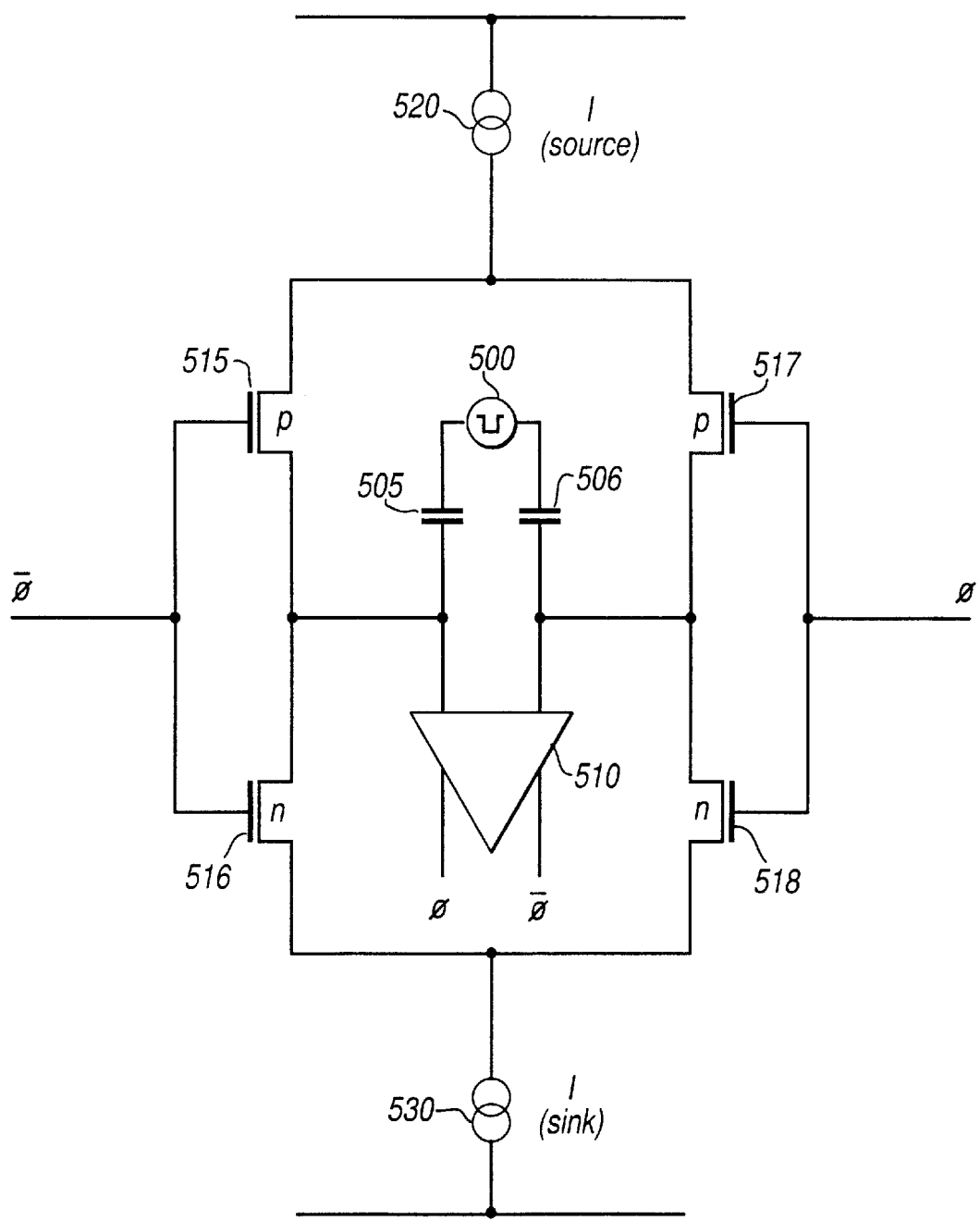
FIG. 12 shows an example constitution of duty cycle control circuitry, in an embodiment of the present invention.

FIG. 12 shows an example of circuitry which can be employed with the present invention to provide a substantially 50% duty cycle clock. In the FIG. 12 circuitry, an external oscillating current source 500 is connected to differential inputs of internal amplifier 510 via coupling capacitors 505 and 506 to produce complementary square-wave clock signals $\phi$ and $\bar{\phi}$ at the outputs of the amplifier 510, which are used as the internal clock. These clock signals $\phi$ and $\bar{\phi}$ are in turn used to control differential switches 515/516 and 517/518 connected between a current source 520 and a current sink 530, so that when the duty cycle of clock $\phi$ tends away from 50%, current is either sourced into or sunk from coupling capacitors 505 and 506 to compensate. With such circuitry, the duty cycle of complementary clock signals φ and φ̄ tends to stabilise at substantially 50%.

It would also be possible to generate the clock signal CLK, having a frequency f/2, by inputting an external clock having a frequency f and using a frequency divider (for example a D-type flip-flop) to divide it by two. The duty cycle of such a clock signal should be substantially 50%.

Although the foregoing embodiments have been adapted for use in a DAC, it will be appreciated that in other embodiments the present invention can be applied to any suitable kind of mixed-signal circuitry where one or more digital signals for application to analog circuitry must be generated at a high frequency. For example, the invention can also be applied in programmable current generation, in mixers and in analog-to-digital converters.

It will also be understood that, although a very simple form of digital interpolation filter was described by way of example, circuitry embodying the present invention can be used with any suitable form of digital interpolation filter to provide the two (or more) sets of samples to the inputs of the circuitry.

What is claimed is:

1. Mixed-signal circuitry, operative repetitively to perform a series of processing cycles, comprising:

analog circuitry operable in each said processing cycle to receive a digital signal and to produce one or more analog signals in dependence upon the received digital signal; and digital circuitry, connected to said analog circuitry for applying such a digital signal thereto in each said processing cycle, and comprising a first circuitry portion which provides said digital signal in first processing cycles of said series and a second circuitry portion, separate from said first circuitry portion, which provides said digital signal in second processing cycles of said series different from, and interleaved with, said first processing cycles, each said circuitry portion being operable to perform a predetermined digital processing operation to produce the digital signal to be applied to the analog circuitry in a given one of said processing cycles, and said digital processing operations being performed by each said circuitry portion with a frequency that is a factor of at least two lower than the processing-cycle frequency.

2. Mixed-signal circuitry as claimed in claim 1, wherein said first and second circuitry portions each have an output at which said digital signal derived by the circuitry portion concerned is produced, and the mixed-signal circuitry further comprises a multiplexer connected to the respective outputs of the first and second circuitry portions for receiving therefrom the digital signals produced thereby and operable in each said first processing cycle to select the output of said first circuitry portion and operable in each said second processing cycle to select the output of said second circuitry portion.

3. Mixed-signal circuitry as claimed in claim 2, wherein said multiplexer is operable to change the output selection in response to both rising and falling edges in a clock signal having a frequency of half said processing-cycle frequency.

4. Mixed-signal circuitry as claimed in claim 3, further comprising a duty cycle controller for automatically maintaining a duty cycle of said clock signal at substantially 50%.

5. Mixed-signal circuitry as claimed in claim 3, wherein said first circuitry portion is responsive to a first clock signal and said second circuitry portion is responsive to a second clock signal complementary to the first clock signal, said first and second clock signals each having a frequency equal to the frequency of said processing operations performed by each said circuitry portion.

6. Mixed-signal circuitry as claimed in claim 5, wherein the number of said circuitry portions is two and the frequency of each of said first and second clock signals is one half of said processing-cycle frequency.

7. Mixed-signal circuitry as claimed in claim 6, wherein said first and second clock signals and said clock signal of said multiplexer are derived from the same source clock signal.

8. Mixed-signal circuitry as claimed in claim 1, wherein said digital circuitry comprises at least one further such circuitry portion, the or each such further circuitry portion serving to provide said digital signal in further processing cycles of said series different from, and interleaved with, said first and second processing cycles, the or each said further circuitry portion being operable to perform a predetermined digital processing operation to produce the digital signal to be applied to the analog circuitry in a given one of said processing cycles, and the frequency of said digital processing operations performed by each said circuitry portion of the digital circuitry being a factor of n lower than said processing-cycle frequency, where n is the total number of said circuitry portions in said digital circuitry.

9. Mixed-signal circuitry as claimed in claim 8, wherein the number n of said circuitry portions is 4.

10. Mixed-signal circuitry as claimed in claim 9, comprising two stages of multiplexer elements, the first stage comprising two multiplexer elements and the second stage comprising one multiplexer element, and further comprising a latch element connected between each of said first-stage multiplexer elements and said second-stage multiplexer element.

11. Mixed-signal circuitry as claimed in claim 1, wherein in each said digital processing operation performed by one of said circuitry portions the circuitry portion concerned receives an item of data and derives such a digital signal from the received data item.

12. Mixed-signal circuitry as claimed in claim 11, wherein said digital circuitry receives such items of data at said processing-cycle frequency and each received item is applied to a selected one of the circuitry portions in accordance with the interleaving of the first and second and any further processing cycles such that the first circuitry portion produces such a digital signal, dependent upon one of the received data items applied thereto, in each said first processing cycle and said second circuitry portion produces such a digital signal, dependent upon one of the received data items applied thereto, in each said second processing cycle, and so on for each, if any, said further circuitry portion.

13. Mixed-signal circuitry as claimed in claim 11, wherein said analog circuitry is operable in each said processing cycle to receive a plurality of such digital signals and to produce its said one or more analog signals in dependence upon the received plurality of digital signals; and each said circuitry portion comprises decoder circuitry for deriving said plurality of digital signals from one such received item of data.

14. Mixed-signal circuitry as claimed in claim 13, wherein said decoder circuitry comprises a binary-thermometer decoder and each received item of data is a binary input word and said digital signals of said plurality are thermometer-coded signals derived from the binary input word.

15. Mixed-signal circuitry as claimed in claim 13, wherein said decoder circuitry comprises a plurality of individual decoder circuits corresponding respectively to the digital signals of said plurality, each said decoder circuit serving to produce its corresponding one of the digital signals of said plurality, and each said circuitry portion has an output latch circuit connected between said analog circuitry and each such decoder circuit for latching the digital signal produced by the decoder circuit concerned.

16. Mixed-signal circuitry as claimed in claim 1, wherein the or each said digital signal is a complementary digital signal pair.

17. Digital-to-analog conversion circuitry, operative repetitively to perform a series of processing cycles, comprising:

analog circuitry operable in each said processing cycle to receive a digital signal and to produce one or more analog signals in dependence upon the received digital signal; and digital circuitry, connected to said analog circuitry for applying such a digital signal thereto in each said processing cycle, and comprising a first circuitry portion which provides said digital signal in first processing cycles of said series and a second circuitry portion, separate from said first circuitry portion, which provides said digital signal in second processing cycles of said series different from, and interleaved with, said first processing cycles, each said circuitry portion being operable to perform a predetermined digital processing operation to produce the digital signal to be applied to the analog circuitry in a given one of said processing cycles, and said digital processing operations being performed by each said circuitry portion with a frequency that is a factor of at least two lower than the processing-cycle frequency.

18. Digital-to-analog conversion circuitry as claimed in claim 17, formed as an integrated-circuit device, wherein each said circuitry portion has its own separate input terminal or set of input terminals accessible by further circuitry external to the device.

19. Digital-to-analog conversion circuitry as claimed in claim 17, wherein in each said digital processing operation performed by one of said circuitry portions the circuitry portion concerned receives an item of data and derives such a digital signal from the received data item, the conversion circuitry further comprising:

a digital interpolation filter, having an input for receiving a series of digital input words and also having a plurality of outputs connected respectively to said circuitry portions, for carrying out interpolation operations on the digital input words of said series to derive therefrom a corresponding series of said items of data and for supplying those items to said outputs, the items of data of said corresponding series having a higher frequency than the input-word frequency.

20. Digital-to-analog conversion circuitry as claimed in claim 19, wherein said digital circuitry and said digital interpolation filter are formed together in the same integrated circuit device.

* * * * *